(12) United States Patent
Kim et al.

(10) Patent No.: US 8,178,877 B2
(45) Date of Patent: May 15, 2012

(54) THIN FILM TRANSISTOR AND METHOD FOR FABRICATING THIN FILM TRANSISTOR

(75) Inventors: Sun Jae Kim, Seoul (KR); Min Koo Han, Seoul (KR)

(73) Assignee: SNU R & DB Foundation, Seoul (KR)

( * ) Notice: Subject to any disclaimer, the term of this patent is extended or adjusted under 35 U.S.C. 154(b) by 141 days.

(21) Appl. No.: 12/794,062

(22) Filed: Jun. 4, 2010

(65) Prior Publication Data
US 2011/0198592 A1 Aug. 18, 2011

(30) Foreign Application Priority Data
Feb. 18, 2010 (KR) .................. 10-2010-0014499

(51) Int. Cl.
*H01L 29/786* (2006.01)
*H01L 21/86* (2006.01)
(52) U.S. Cl. .................. 257/57; 257/66; 257/E21.704; 257/E29.29; 257/E29.293; 438/151; 977/700

(58) Field of Classification Search .................. 257/57, 257/66, E21.704, E29.29, E29.293; 438/151
See application file for complete search history.

(56) References Cited

U.S. PATENT DOCUMENTS
2005/0110090 A1* 5/2005 Koo et al. .................. 257/347
2008/0111125 A1* 5/2008 Kim et al. .................. 257/40

FOREIGN PATENT DOCUMENTS
JP 2005-159304 6/2005
* cited by examiner

*Primary Examiner* — Benjamin Sandvik
*Assistant Examiner* — Whitney T Moore
(74) *Attorney, Agent, or Firm* — Yoo & Associates

(57) ABSTRACT

Disclosed are a thin film transistor having high reliability and providing a simplified fabricating process, and a method of fabricating the thin film transistor. In the method, a dielectric substrate is prepared, a semiconductor layer is formed on the dielectric substrate, a gate dielectric film is formed on the semiconductor layer, a first gate electrode is formed on the gate dielectric film, a second gate electrode contacting a side wall of the first gate electrode is formed, and impurities are implanted into the semiconductor layer using the first gate electrode as a mask.

19 Claims, 4 Drawing Sheets

THIN FILM TRANSISTOR AND METHOD FOR FABRICATING THIN FILM TRANSISTOR

CROSS-REFERENCE TO RELATED APPLICATION

This application claims priority to and the benefit of Korean Patent Application No. 10-2010-0014499 filed on Feb. 18, 2010, which is herein incorporated by reference in its entirety.

BACKGROUND OF THE INVENTION

1. Field of the Invention

The present invention relates generally to a thin film transistor and a method for fabricating the thin film transistor.

2. Description of the Related Art

Generally, a thin film transistor (TFT) includes a semiconductor layer, a gate electrode, a source electrode, and a drain electrode. The semiconductor layer includes a source region, a drain region, and a channel region disposed between the source region and the drain region. The semiconductor layer may be formed of amorphous silicon or poly-crystalline silicon. However, since electron mobility of poly-crystalline silicon is higher than that of amorphous silicon, poly-crystalline silicon is widely used for a semiconductor layer of a TFT. Hereinafter, a thin film transistor including a semiconductor layer formed of poly-crystalline silicon is referred to as poly-crystalline silicon thin film transistor, and a thin film transistor including a semiconductor layer formed of amorphous silicon is referred to as an amorphous silicon thin film transistor.

However, a poly-crystalline silicon thin film transistor has a greater off-current than that of an amorphous silicon thin film transistor. To address this limitation of poly-crystalline silicon thin film transistors, a structure in which a lightly doped region is disposed between a source/drain region of a poly-crystalline silicon thin film transistor, i.e., a heavily doped region and a channel region has been suggested. That is, a lightly doped drain (LDD) structure has been suggested. However, thin film transistors having an LDD structure are susceptible to degradation due to implantation of hot carriers near a drain region, that is, inferior in reliability characteristics to thin film transistors having a gate overlapped lightly doped drain (GOLDD) structure that will be described later.

In detail, a thin film transistor having the so-called GOLDD structure, in which a gate electrode overlaps the lightly doped region, prevents implantation of hot carriers near a drain region, thus remarkably suppressing degradation. That it, a thin film transistor having a GOLDD structure has more improved reliability than a thin film transistor having an LDD structure.

A method of fabricating a related art thin film transistor having a GOLDD structure is as follows. A dielectric substrate, a buffer layer, a semiconductor layer, and a gate dielectric film are sequentially stacked, and then, the semiconductor layer is lightly doped with impurities. At this point, a predetermined portion is prevented from being doped with impurities by a photoresist, and the predetermined portion functions as a channel of the thin film transistor. Thereafter, a gate electrode is formed on the gate dielectric film to cover the upper portion of a channel region and partially cover the upper portions of source/drain regions with the gate electrode being spaced apart from the channel region and the source/drain regions. Then, the gate electrode is used as a mask to heavily dope the semiconductor layer with impurities. Accordingly, the semiconductor layer is divided into a lightly doped GOLDD region that overlaps a predetermined region of the gate electrode, and the heavily doped source/drain region that does not overlap the predetermined region of the gate electrode. After that, contact holes and source/drain electrodes are formed to complete the thin film transistor having the GOLDD structure.

SUMMARY OF THE INVENTION

An aspect of the present invention provides a thin film transistor having high reliability and providing a simplified fabricating process, and a method for fabricating the thin film transistor.

According to at least one of embodiments, a method of fabricating a thin film transistor includes: preparing a dielectric substrate; forming a semiconductor layer on the dielectric substrate; forming a gate dielectric film on the semiconductor layer; forming a first gate electrode on the gate dielectric film; forming a second gate electrode contacting a side wall of the first gate electrode; and implanting impurities into the semiconductor layer using the first gate electrode as a mask.

In the implanting of the impurities, the semiconductor layer may be divided into a source region without overlapping the first and second gate electrodes, a drain region without overlapping the first and second gate electrodes, a gate overlapped lightly doped drain (GOLDD) region overlapping the second gate electrode, and a channel region overlapping the first gate electrode. The source/drain regions may have a higher doping concentration than that of the GOLDD region.

The method may further include activating the second gate electrode by performing a laser heat treating process on the second gate electrode after the implanting of the impurities.

The second gate electrode may be formed of nanocrystalline silicon.

The method may further include forming a buffer layer on the dielectric substrate after the preparing of the dielectric substrate.

According to another embodiment, a thin film transistor includes: a substrate formed of a dielectric material; a semiconductor layer disposed on the substrate and including a source region, a drain region, a gate overlapped lightly doped drain (GOLDD) region, and a channel region disposed within the GOLDD region; a gate dielectric film disposed on the semiconductor layer; a first gate electrode disposed on the gate dielectric film and overlapping the channel region of the semiconductor layer; and a second gate electrode disposed on a side surface of the first gate electrode and overlapping the GOLDD region of the semiconductor layer.

The source region and the drain region may have a higher doping concentration than that of the GOLDD region.

The second gate electrode may be formed of nanocrystalline silicon, and a laser heat treating process may be performed on the second gate electrode.

BRIEF DESCRIPTION OF THE DRAWINGS

The above and other features and advantages will become more apparent to those of ordinary skill in the art by describing in detail exemplary embodiments with reference to the attached drawings, in which.

In the following description, the same or similar elements are labeled with the same or similar reference numbers.

DETAILED DESCRIPTION

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Preferred embodiments of the present invention will now be described in detail with reference to the accompanying drawings.

Figure 1:
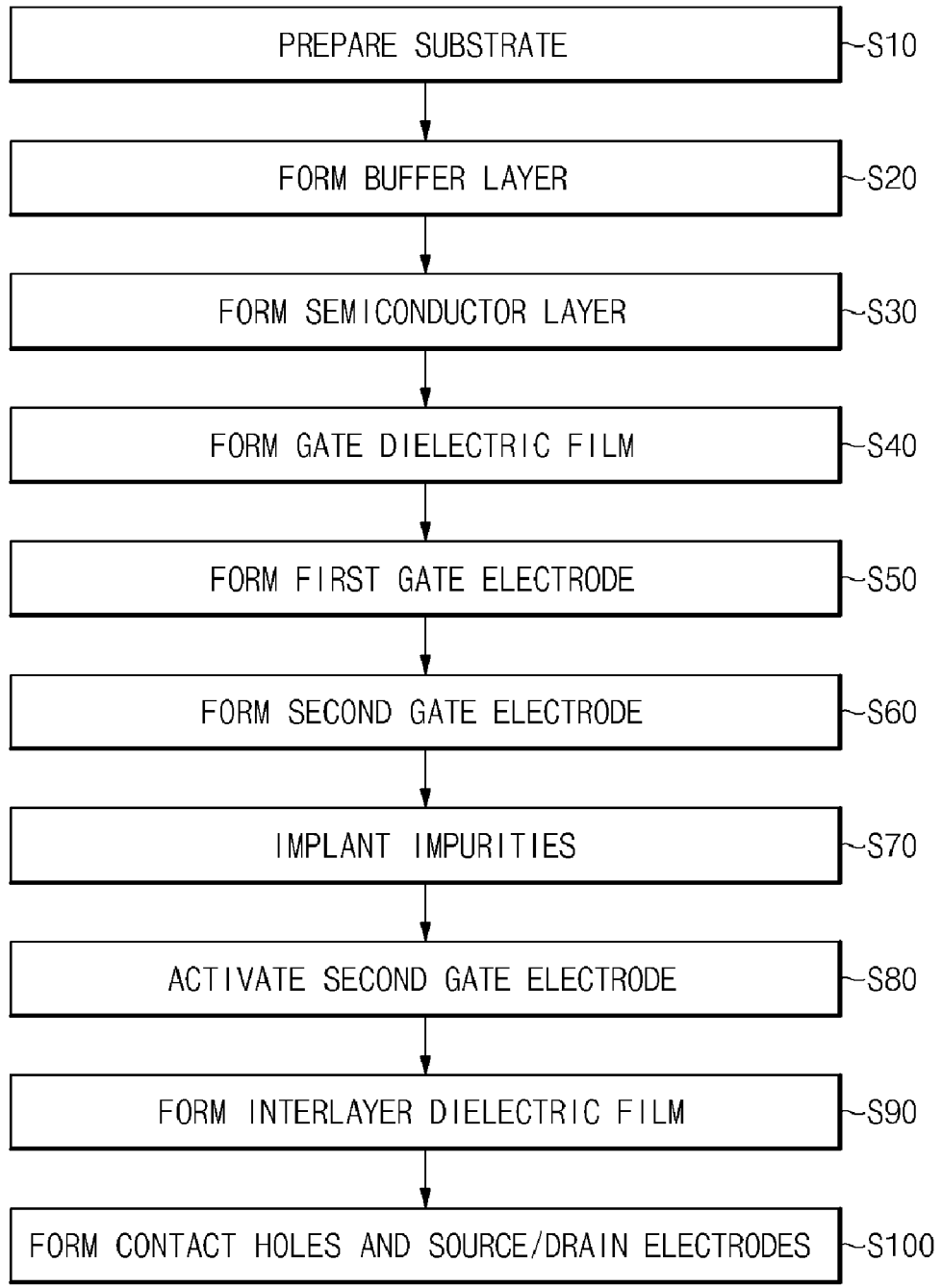
FIG. 1 is a flow chart illustrating a method of fabricating a thin film transistor according to an embodiment.

FIG. 1 is a flow chart illustrating a method of fabricating a thin film transistor according to an embodiment. FIGS. 2A through 2I are schematic views illustrating a process of fabricating the thin film transistor according to the current embodiment.

Referring to FIG. 1, the method of fabricating the thin film transistor according to the current embodiment includes preparing a substrate in operation S10, forming a semiconductor layer in operation S30, forming a gate dielectric film in operation S40, forming a first gate electrode in operation S50, forming a second gate electrode in operation S60, and implanting impurities in operation S70. Further, the method of fabricating the thin film transistor according to the current embodiment may include forming a buffer layer in operation S20, activating the second gate electrode in operation S80, forming an interlayer dielectric film in operation S90, and forming contact holes and source/drain electrodes in operation S100.

Figure 2A:
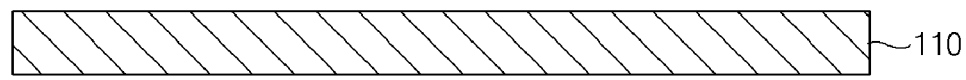
FIGS. 2A through 2I are schematic views illustrating a process of fabricating a thin film transistor according to an embodiment.

Referring to FIGS. 1 and 2A, in operation S10, a substrate 110 is prepared. The substrate 110 may be formed of glass or plastic. It should be noted that the listing of the above materials should not be seen as to limit the scope of the present invention. Other materials may be used without departing from the spirit and scope of the present invention.

Figure 2B:
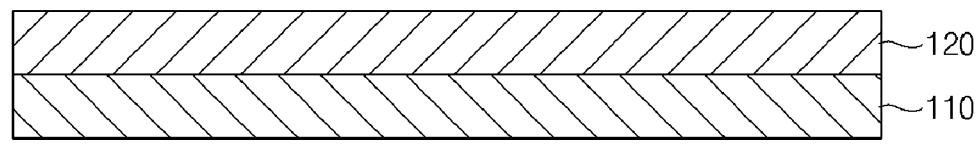

Referring to FIGS. 1 and 2B, in operation S20, a buffer layer 120 is formed on the substrate 110. The buffer layer 120 may include a silicon oxide film or a silicon nitride film. However, other types of film may be used without departing from the spirit and scope of the present invention. The buffer layer 120 prevents impurities from leaking out of the upper portion of the substrate 110.

Figure 2C:
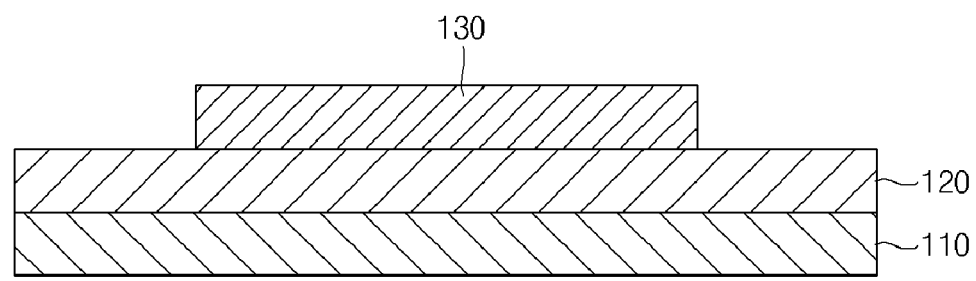

Referring to FIGS. 1 and 2C, in operation S30, a semiconductor layer 130 is formed on the buffer layer 120. The formation of the semiconductor layer 130 is as follows. First, an amorphous silicon layer is deposited on the buffer layer 120 using a method such as chemical vapor deposition or sputtering. Then, the amorphous silicon layer is crystallized using a method such as eximer laser annealing (ELA), sequential lateral solidification (SLS), or metal induced lateral crystallization (MILC). Then, the crystallized silicon layer is patterned to form the semiconductor layer 130. Alternatively, the semiconductor layer 130 may be formed by depositing nanocrystalline silicon through one of plasma enhanced chemical vapor deposition (PECVD), inductively coupled plasma chemical vapor deposition (ICP-CVD), and electron cyclotron resonance chemical vapor deposition (ECR-CVD). Since nanocrystalline silicon may have a crystallinity of about 70% or greater while being deposited, an additional crystallization process may be unnecessary. It should be noted that the method for forming the semiconductor layer is not limited to the above mentioned methods.

Figure 2D:
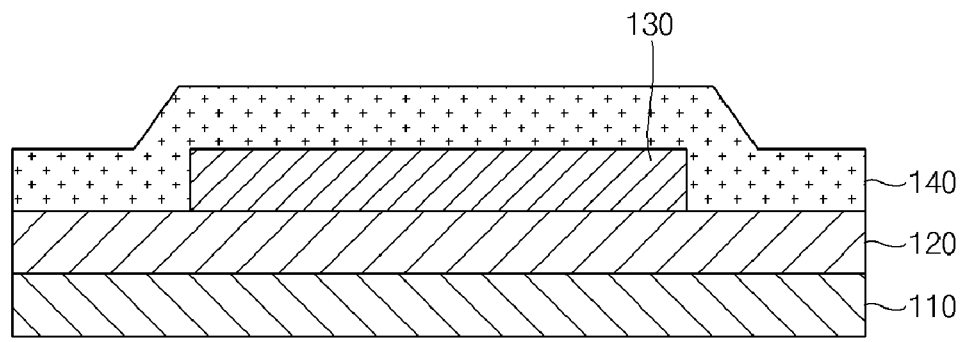

Referring to FIGS. 1 and 2D, in operation S40, a gate dielectric film 140 is formed on the buffer layer 120 and the semiconductor layer 130. The gate dielectric film 140 may include a silicon oxide film, a silicon nitride film, or a double layer of a silicon oxide film and a silicon nitride film. However, other types of film may be used without departing from the spirit and scope of the present invention. The gate dielectric film 140 may be formed using a method such as chemical vapor deposition. It should be noted that the method for forming the gate dielectric film is not limited to the above mentioned method.

Figure 2E:
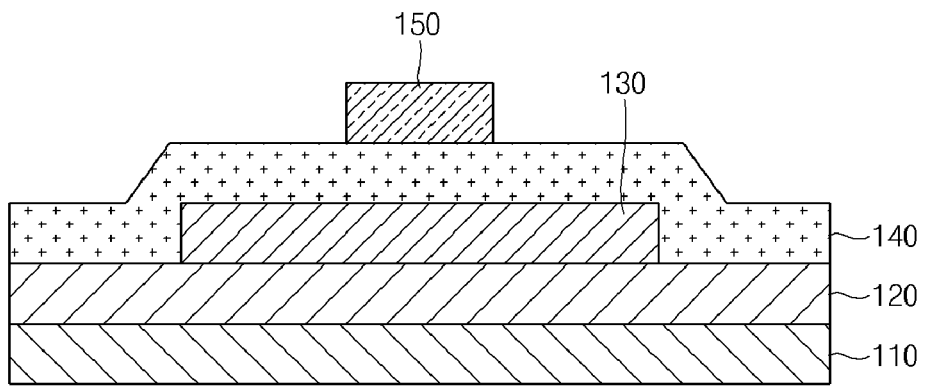

Referring to FIGS. 1 and 2E, in operation S50, a first gate electrode 150 is formed on the gate dielectric film 140. In detail, the first gate electrode 150 is disposed on the gate dielectric film 140 such that the first gate electrode 150 is spaced apart from the semiconductor layer 130 and overlaps a predetermined region of the semiconductor layer 130. The first gate electrode 150 may be formed of one selected from the group consisting of aluminum, aluminum alloy, molybdenum, and molybdenum alloy. However, the present invention is not limited to such materials. The first gate electrode 150 may be formed using a sputtering method. It should be noted that the method for forming the first gate dielectric is not limited to the above mentioned method.

Figure 2F:
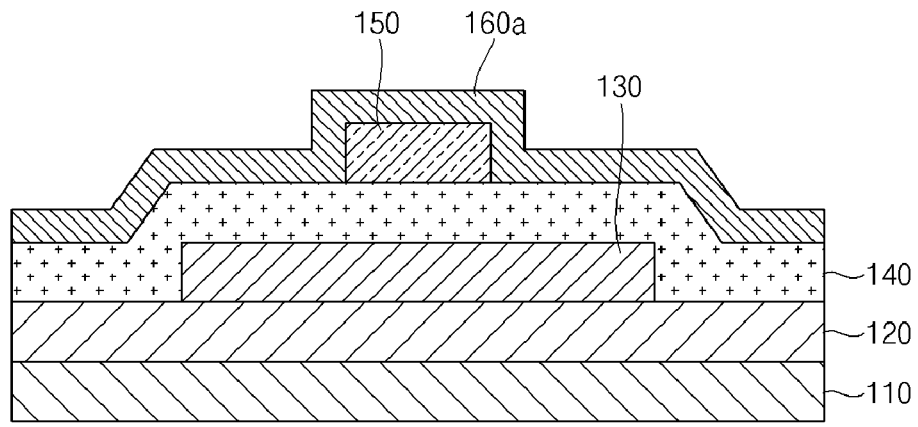
Figure 2G:
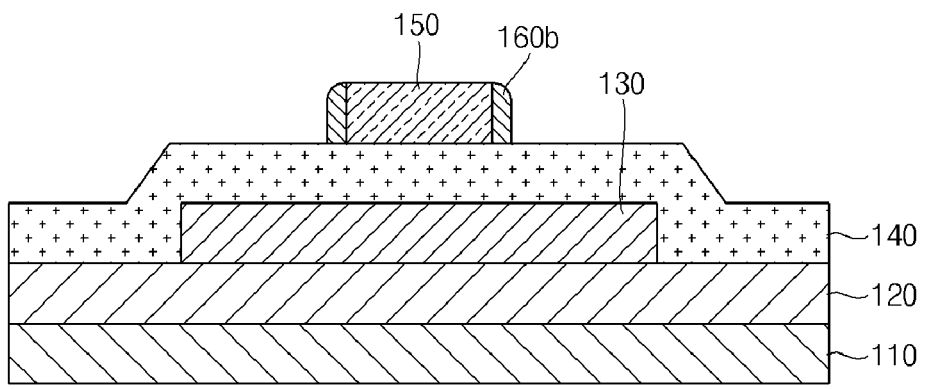

Referring to FIG. 1 and FIGS. 2F and 2G, in operation S60, a second gate electrode 160 is formed to contact the side wall of the first gate electrode 150 on the gate dielectric film 140. The second gate electrode 160 may be formed of nanocrystalline silicon. In detail, the second gate electrode 160 may be formed by depositing a nanocrystalline silicon layer 160a on the gate dielectric film 140 and the first gate electrode 150, and then, by etching the nanocrystalline silicon layer 160a.

Figure 2H:
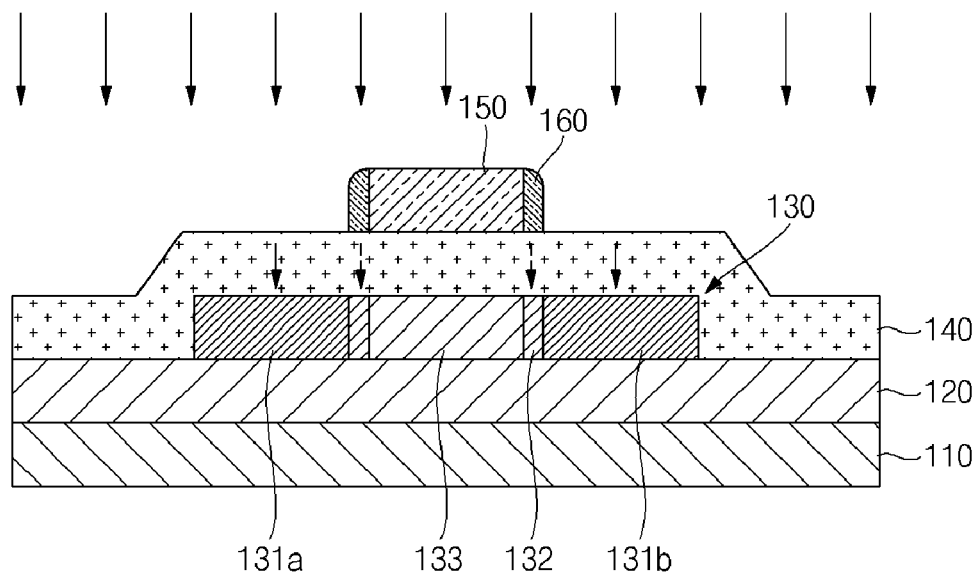

Referring to FIGS. 1 and 2H, in operation S70, high-concentration impurities (n+) are implanted into the semiconductor layer 130 by using the first gate electrode 150 as a mask. At this point, predetermined regions of the semiconductor layer 130, which are not covered with the first and second gate electrodes 150 and 160, are formed as a source region 131a and a drain region 131b that are doped with the high-concentration impurities (n+). Then, the second gate electrode 160 formed of silicon is doped with impurities first, and the semiconductor layer 130 under the second gate electrode 160 is doped with the rest except for the impurities used to dope the second gate electrode 160. In other words, the semiconductor layer 130 under the second gate electrode 160 is doped with low-concentration impurities (n−) to form a gate overlapped lightly doped drain (GOLDD) region 132. That is, the GOLDD region 132 has a lower doping concentration than those of the source region 131a and the drain region 131b. The width of the GOLDD region 132 is easily controlled by adjusting the width of the second gate electrode 160 in operation S60. The first gate electrode 150 prevents impurities from being implanted into a portion of the semiconductor layer 130 under the first gate electrode 150, that is, a portion of the semiconductor layer 130 within the GOLDD region 132, so that the portion of the semiconductor layer 130 within the GOLDD region 132 is formed as a channel region 133. The impurities may be one of boron (B), arsenic (As), and phosphor (P). However, the present invention is not limited to such materials.

For example, in operation S70, the impurities may be implanted under process conditions having an impurity dose of about $5\times10^{15}$ (5e15) ions/cm$^3$ and an acceleration energy of about 50 keV. As used herein, expression "5e15" has its usual and well-understood meaning as exponential value, i.e., $5\times10^{15}$.

In operation S80, the second gate electrode 160 doped with the high-concentration impurities in operation S70 is activated to be conductive. The second gate electrode 160 may be activated using laser heat treating such as an ELA method. Since the second gate electrode 160 is activated, the first and second gate electrodes 150 and 160 function as a gate electrode.

Figure 2I:
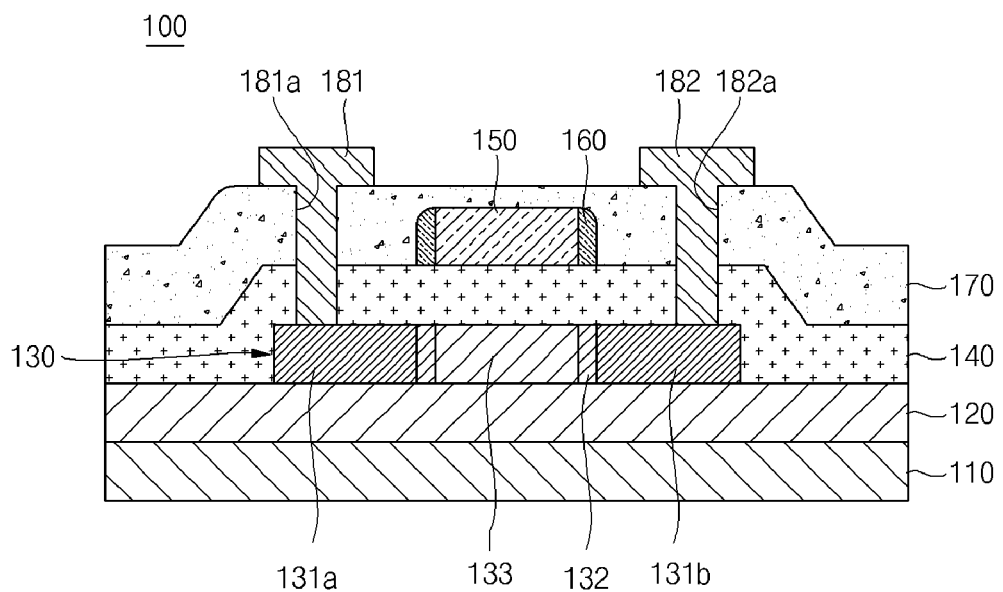

Referring to FIGS. 1 and 2I, in operation S90, an interlayer dielectric film 170 is formed on the gate dielectric film 140 and the first and second gate electrodes 150 and 160. The interlayer dielectric film 170 may be formed as a silicon oxide film, silicon nitride film, or a double layer thereof. However, other types of film may be used without departing from the spirit and scope of the present invention.

In operation S100, the gate dielectric film 140 and the interlayer dielectric film 170 are patterned first to expose portions of the source region 131a and the drain region 131b and form contact holes 181a and 182a. Then, in operation S100, after the contact holes 181a and 182a are formed, a conductive film is deposited on the interlayer dielectric film 170 and is patterned to form a source electrode 181 and a drain electrode 182 that are electrically connected to the source region 131a and the drain region 131b.

According to the present disclosure, the source region, the drain region, the GOLDD region, and the channel region of the thin film transistor can be formed through the single impurity implantation process. That is, the method of fabricating the transistor having the GOLDD region can be simplified.

In addition, according to the present disclosure, the width of the GOLDD region can be easily controlled by adjusting the width of the second gate electrode of the thin film transistor.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A method of fabricating a thin film transistor comprising:
    preparing a dielectric substrate;
    forming a semiconductor layer on the dielectric substrate;
    forming a gate dielectric film on the semiconductor layer;
    forming a first gate electrode on the gate dielectric film;
    forming a second gate electrode contacting a side wall of the first gate electrode, wherein the second gate electrode is formed of nanocrystalline silicon; and
    implanting impurities into the semiconductor layer using the first gate electrode as a mask.

2. The method of claim 1 wherein the implanting comprises dividing the semiconductor layer into a source region without overlapping the first and second gate electrodes, a drain region without overlapping the first and second gate electrodes, a gate overlapped lightly doped drain (GOLDD) region overlapping the second gate electrode, and a channel region overlapping the first gate electrode.

3. The method of claim 2 wherein the source region and drain region have a higher doping concentration than that of the GOLDD region.

4. The method of claim 3 further comprising activating the second gate electrode by performing a laser heat treating process on the second gate electrode after the implanting.

5. The method of claim 1 further comprising forming a buffer layer on the dielectric substrate after the preparing the dielectric substrate.

6. The method of claim 5 wherein the buffer layer is selected from the group consisting of silicon oxide film, and silicon nitride film.

7. The method of claim 1 wherein the gate dielectric film is selected from the group consisting of silicon oxide film, and silicon nitride film.

8. The method of claim 1 wherein the first gate electrode is selected from the group consisting of aluminum, aluminum alloy, molybdenum, and molybdenum alloy.

9. The method of claim 1 wherein the impurities are implanted having an impurity dose of about $5\times10^{15}$ (5e15) ions/cm$^3$ and an acceleration energy of about 50 keV.

10. A thin film transistor comprising;
    a substrate formed of a dielectric material;
    a semiconductor layer disposed on the substrate and the semiconductor layer comprises a source region, a drain region, a gate overlapped lightly doped drain (GOLDD) region, and a channel region disposed within the GOLDD region;
    a gate dielectric film disposed on the semiconductor layer;
    a first gate electrode disposed on the gate dielectric film and overlapping the channel region of the semiconductor layer; and
    a second gate electrode disposed on a side surface of the first gate electrode and overlapping the GOLDD region of the semiconductor layer, wherein the second gate electrode is formed of nanocrystalline silicon.

11. The thin film transistor of claim 10 wherein the source region and the drain region have a higher doping concentration than that of the GOLDD region.

12. The thin film transistor of claim 10 wherein a laser heat treating process is performed on the second gate electrode.

13. The thin film transistor of claim 10 further comprising a buffer layer disposed between the substrate and the semiconductor layer.

14. The thin film transistor of claim 13 wherein the buffer layer is selected from the group consisting of silicon oxide film, and silicon nitride film.

15. The thin film transistor of claim 10 wherein the gate dielectric film is selected from the group consisting of silicon oxide film, and silicon nitride film.

16. The thin film transistor of claim 10 wherein the first gate electrode is selected from the group consisting of aluminum, aluminum alloy, molybdenum, and molybdenum alloy.

17. A method of fabricating a thin film transistor comprising:
preparing a substrate;
forming a buffer layer on the substrate;
forming a semiconductor layer on the buffer layer;
forming a gate dielectric film on the semiconductor layer using a chemical vapor deposition process;
forming a first gate electrode on the gate dielectric film using a sputtering process;
forming a second gate electrode contacting a side wall of the first gate electrode, wherein the second gate electrode is formed of nanocrystalline silicon; and
implanting impurities into the semiconductor layer using the first gate electrode as a mask.

18. The method of claim 17 wherein the implanting comprises dividing the semiconductor layer into a source region without overlapping the first and second gate electrodes, a drain region without overlapping the first and second gate electrodes, a gate overlapped lightly doped drain (GOLDD) region overlapping the second gate electrode, and a channel region overlapping the first gate electrode.

19. The method of claim 18 wherein the source region and the drain region have a higher doping concentration than that of the GOLDD region.

* * * * *